United States Patent [19]
Klass

[11] Patent Number: 5,898,330
[45] Date of Patent: Apr. 27, 1999

[54] EDGE-TRIGGERED STATICIZED DYNAMIC FLIP-FLOP WITH SCAN CIRCUITRY

[75] Inventor: Edgardo F. Klass, Palo Alto, Calif.

[73] Assignee: Sun Microsystems, Inc., Palo Alto, Calif.

[21] Appl. No.: 08/868,614

[22] Filed: Jun. 3, 1997

[51] Int. Cl.$^6$ .................................. H03K 19/003
[52] U.S. Cl. ........................ 327/210; 327/211; 327/212; 326/98
[58] Field of Search ........................ 327/199–203, 327/208–212, 214, 218; 326/98

[56] References Cited

U.S. PATENT DOCUMENTS

| | | | |
|---|---|---|---|
| 5,440,243 | 8/1995 | Lyon | 326/33 |
| 5,461,331 | 10/1995 | Schorn | 326/83 |
| 5,461,649 | 10/1995 | Bailey et al. | 327/28 |
| 5,497,114 | 3/1996 | Shimozono et al. | 327/202 |
| 5,517,136 | 5/1996 | Harris et al. | 326/93 |
| 5,760,627 | 6/1998 | Gregor et al. | 327/215 |

OTHER PUBLICATIONS

"Power Saving Latch" IBM Technical Disclosure Bulletin, vol. 39, No. 04, 1996, pp. 65–66, Apr. 1996.
Jiren Yuan and Christer Svensson, "New Single–Clock CMOS Latches and Flipflops with Improved Speed and Power Savings," IEEE Journal of Solid–State Circuits, vol. 31 (No. 1), pp. 62–69 (Jan. 21, 1997).
Neela Bhakta Gaddis et al., "A 56–Entry Instruction Reorder Buffer," pp. 212–213, Digest Of Technical Papers, IEE International Solid–State Circuits Conference. (Feb. 9, 1996).
Hamid Partovi, et al., "Flow–Through Latch and Edge–Triggered Flip–Flop Hybrid Elements," Digital Clocks And Latches, IEEE/ISSCC Slide Supplment, pp. 104–105, (Aug. 21, 1996).

Author unknown; "Cascading Dynamic Gates"; CMOS Dynamic Gates; pp. 216–217.

Yuan Ji–Ren, et al., "A True Single–Phase–Clock Dynamic CMOS Circuit Technique," IEEE Journal of Solid–State Circuits, IEEE, vol. 22 (No. 5), pp. 899–900, (Oct. 21, 1987).

Primary Examiner—Timothy P. Callahan
Assistant Examiner—Tuan T. Lam
Attorney, Agent, or Firm—The Law Offices of Bever & Hoffman, LLP

[57] ABSTRACT

A flip-flop circuit with scan circuitry for use with static logic gates includes a dynamic input stage and a static output stage. The dynamic input stage is coupled to receive a data signal, a scan input signal, a scan enable signal, a data enable signal and a single-phase clock signal. During the precharge phase, the dynamic input stage provides an output signal that is the complement of the data or the scan signal. The dynamic input stage output signal is precharged to a logic high level during the precharge phase. During the precharge phase, the static output stage maintains the flip-flop output signal logic at the logic level of the previous evaluation phase independently of the signal received from the dynamic input stage. During the evaluation phase in the normal mode, the dynamic input stage generates an output signal that either remains at a logic high level or else transitions from high-to-low, complementing the logic level of the data signal. During the evaluation phase in the scan mode, the dynamic input stage outputs the complement of the scan input signal that either remains at a logic high level or else transitions from high-to-low, complementing the logic level of the scan input signal. The static output stage receives the output signal from the dynamic input stage and the clock signal. During the evaluation phase, the static output stage outputs the complement of the output signal received from the dynamic input stage.

20 Claims, 5 Drawing Sheets

EDGE-TRIGGERED STATICIZED DYNAMIC FLIP-FLOP WITH SCAN CIRCUITRY

FIELD OF THE INVENTION

The present invention relates to digital circuits and, more particularly, to flip-flops. Still more particularly, the present invention relates to staticized dynamic flip-flops having scan circuitry.

BACKGROUND

Many high performance circuits such as, for example, microprocessors, use static flip-flops. Generally, these static flip-flops are master-slave edge-triggered flip-flops. However, as the speeds of these high performance circuits increase, the use of conventional master-slave edge-triggered flip-flops becomes unattractive because these conventional flip-flops are relatively slow and require both the true and complement of the clock signal. Typically, these conventional static flip-flops require special clock buffers or "headers" to generate complementary clock signals.

FIG. 1 is a schematic diagram of a typical conventional master-slave rising edge-triggered static flip-flop 100. The flip-flop 100 includes a master stage 101 driving a slave stage 103. The master stage 101 has a conventional transmission gate 105 having an input lead 106 coupled to receive a data signal D. As is well known, the transmission gate 105 of the master stage is controlled to transmit the received data signal D by the true and complementary clock signals CK and CKB respectively received by the p-channel and n-channel devices implementing the transmission gate 105. Thus, the master stage's transmission gate 105 is controlled to pass the data signal D prior to a rising edge (i.e., while the clock signal CK is at a logic low level).

A conventional latch 107, implemented with the inverters INV1 and INV2, has an input lead connected to an output lead 108 of the transmission gate 105. Thus, while the clock signal CK is at a logic low level, the latch 107 inverts the data signal D and latches the inverted data signal on the output lead of the master stage 101. Then, at the rising edge of the clock signal CK, the transmission gate 105 is no longer conductive, while the latch 107 continues to output the complement of the data signal D at the time of the rising edge.

The slave stage 103 also includes a transmission gate and a latch. However, the transmission gate 109 of the slave stage 103 is configured to be conductive when the transmission gate 105 is non-conductive and vice versa. Typically, the transmission gate of the slave stage is connected to receive the clock signals CK and CKB respectively at the gates of the n-channel and p-channel devices implementing the transmission gate 109. Thus, before the rising edge of the clock signal CK, the transmission gate 109 is non-conductive. However, at the rising edge of the clock signal CK, the transmission gate 109 transmits the latched output signal of the master stage 101 (i.e., the complement of the data signal D at the time of the rising edge) to a conventional output latch 111, implemented with the inverters INV3 and INV4. Thus, the output latch 111 outputs a signal Q equivalent to the data signal D at the time of the rising edge for the rest of the cycle. Counting the delay of the transmission gates as ½ of a typical gate delay, the conventional flip-flop 100 has a latency of about three gate delays, measured from the set-up time of the data signal D (prior to the rising edge of the clock signal CK) to the transition of the flip-flop output signal Q after the rising edge of the clock signal CK. Of course, any improvement in speed of the flip-flop is desirable for most applications.

In addition, the conventional master-slave flip-flop 100 may be modified for testing purposes to include scan test capability, which is well known in the art of flip-flops. For example, in a typical scan design testing scheme, test (or scan) data is loaded into a set of scan flip-flops and then the logic circuitry receiving the scan data is clocked for one cycle. Another set of scan flip-flops stores the output (or capture) data from this logic circuitry, which are then compared to the expected result. If the capture data does not match the expected result, then a possible fault has been detected.

However, the scan functionality typically results in either increased complexity or a speed penalty. For example, as shown in FIG. 1A, in one conventional scan flip-flop design, a scan flip-flop 118 includes a two-input multiplexer formed from the master stage 101 of the flip-flop 100 (FIG. 1). In particular, the scan flip-flop 118 has a master stage 120 identical to the master stage 101 (FIG. 1) with a second transmission gate 122 connected in parallel to the transmission gate 105. The second transmission gate 122 is connected to receive a scan-input signal SI and is clocked by scan clock signals SCK and SCKB. The scan clock signals are provided to the flip-flop 118 only during the scan mode and, conversely, the clock signals CK and CKB are provided to the flip-flop 118 only during the "normal" operational mode.

However, transmission gates typically are relatively large in size, which increases the cost of the flip-flop and occupies area that could otherwise be used for other devices. In addition, transmission gates typically represent a large capacitive load to the signal driver, which therefore causes the driver to be relatively large in size and power dissipation. In this example, the scan flip-flop 118 includes three transmission gates (i.e., the transmission gates 105 and 122 in the master stage 120 and a transmission gate in the slave stage) and, thus, is relatively slow while having a relatively large size and power dissipation. Accordingly, there is a need for a scan flip-flop that is fast while minimizing the size and power dissipation.

SUMMARY

In accordance with the present invention, a staticized dynamic flip-flop with scan circuitry is provided. In one embodiment, the staticized dynamic flip-flop includes a dynamic input stage and a static output stage. Because a flip-flop outputs a static output signal, the flip-flop is intended to be used primarily with static logic. The dynamic input stage is coupled to receive a single-phase clock signal, a data signal D, a scan input signal SI, a scan select signal SCAN_SEL and a data select signal DATA_SEL. In this embodiment, the data select signal DATA_SEL is controlled to be the complement of the SCAN_SEL signal, except during a reset operation in which both the SCAN_SEL and DATA_SEL signals are set to logic low levels. The static output stage is coupled to receive the single-phase clock signal and an internal signal X from the dynamic input stage. The static output stage generates an output signal Q. The dynamic input stage operates in a manner similar to a dynamic logic gate and, thus, can be described as having a precharge phase and an evaluation phase.

In operation during the precharge phase, the dynamic input stage causes the internal signal X to have a predetermined logic level, independent of the logic level of the data signal D and the scan input signal SI. During the precharge phase, the static output stage provides the output signal Q at the same logic level as the previous evaluation phase.

In operation during the evaluation phase in the "normal" mode, the dynamic input stage the causes the internal signal X to have a logic level as a function of the logic level of the data signal D. The static output stage then causes the output signal Q to have a logic level as a function of the logic level of the internal signal X. The flip-flop is configured in the "normal" mode when the signals SCAN_SEL and DATA_SEL are at logic low and logic high levels, respectively.

Through the use of the dynamic input stage, the set-up time of the circuit is zero, thereby decreasing the latency of the flip-flop. Further, because the dynamic input stage causes the internal signal X to be initially at the predetermined logic level at the start of the evaluation phase, the dynamic input stage can be optimized or "skewed" to more quickly cause the logic level of the internal signal X to change in response to the data input signal D. The "precharging" of the internal signal X also allows the output stage to be "skewed" to increase the speed of changing the logic level of the output signal Q caused by the internal signal X in changing from the predetermined logic level. Still further, only a single clock phase is required, unlike the two clock phases required by the aforementioned conventional flip-flops, thereby decreasing the complexity of the clock headers and decreasing the clock line loading.

In operation during the evaluation phase in the "scan mode", the dynamic input stage the causes the internal signal X to have a logic level as a function of the logic level of the scan input signal SI. The static output stage then causes the output signal Q to have a logic level as a function of the logic level of the internal signal X. The flip-flop is configured in the "scan" mode when the signals SCAN_SEL and DATA_SEL are at logic high and logic low levels, respectively.

In another aspect of the present invention, the dynamic input stage includes a shut-off mechanism to provide edge-triggered operation. The shut-off mechanism causes the dynamic input stage to maintain the predetermined logic level of the internal signal X during the evaluation phase if the data signal D does not cause the internal signal X to change within a short predetermined time period from the start of the evaluation phase. In a further refinement, the shut-off mechanism can be configured to be disabled during the evaluation phase when the logic level of the data signal D causes the logic level of the internal signal X to change from the predetermined logic level.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 2:
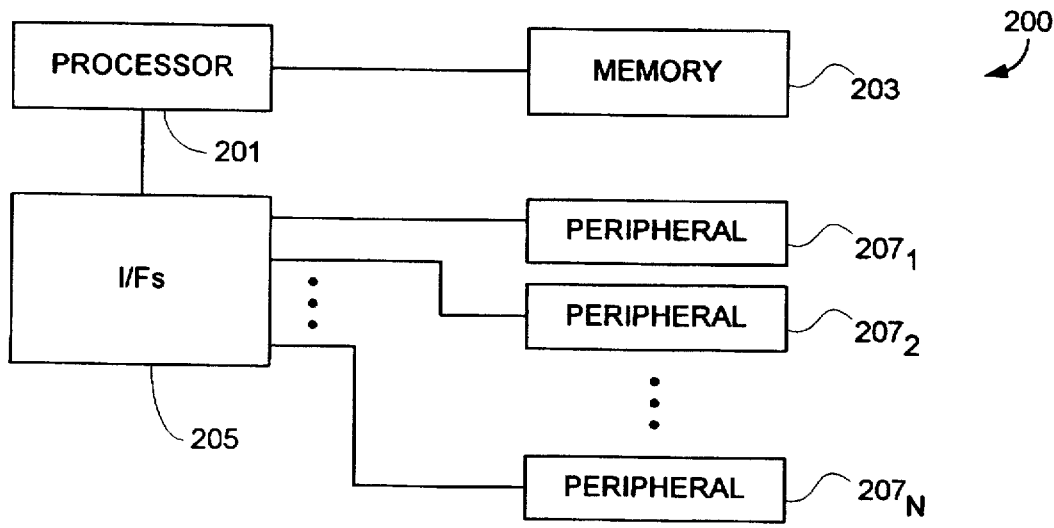
FIG. 2 is a block diagram of an electronic system that includes a staticized dynamic flip-flop according to one embodiment of the present invention.

FIG. 2 is a block diagram of an electronic system 200 according to one embodiment of the present invention. The electronic system 200 includes an integrated circuit 201 with a staticized dynamic flip-flop (several embodiments are described below), a memory 203, interfaces 205 and peripherals $207_1$–$207_N$.

The electronic system 200 can be any type of electronic system. In this embodiment, the electronic system 200 is a computer system in which the integrated circuit 201 is a processor connected to the memory 203 and to interfaces 205. The processor can be any type of processor such as, for example, Pentium®, X86, Sparc®, Alpha®, MIPS®, HP®, and PowerPC® processors. The interfaces 205 are connected to peripherals $207_1$–$207_N$, thereby allowing the processor to interact with these peripherals. The memory 203 and the interfaces 205 can be any type of memory or interface for use in computer systems. Likewise, the peripherals can be any type of peripheral such as, for example, displays, mass storage devices, keyboards or any other type of input or input-output device. In accordance with the present invention, the staticized dynamic flip-flop used in the integrated circuit 210 is faster than conventional static flip-flops, thereby allowing the speed of the integrated circuit 201 to be increased.

Figure 3:
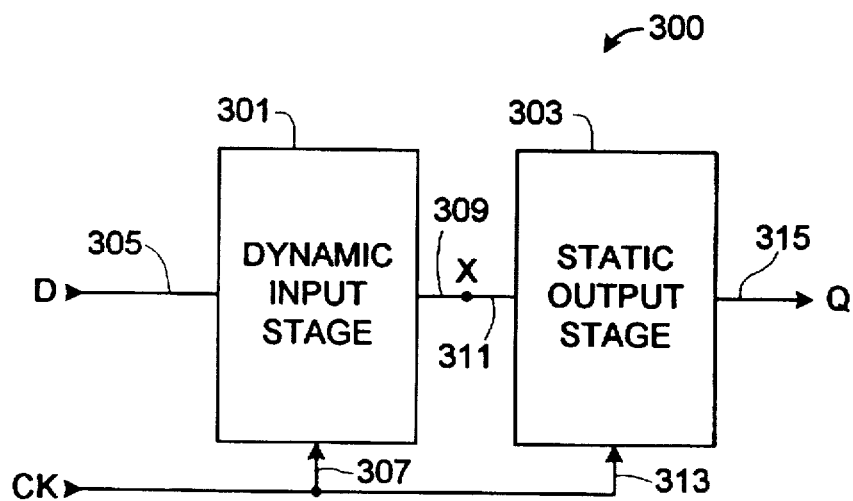
FIG. 3 is a block diagram of a staticized dynamic flip-flip circuit according to one embodiment of the present invention.

FIG. 3 is a block diagram of a flip-flop circuit 300 according to one embodiment of the present invention. In this embodiment, the flip-flop circuit 300 is a single phase (i.e., not requiring the complement of the clock signal) single rail flip-flop circuit (i.e., only outputting a single output signal). The flip-flop circuit 300 includes a dynamic input stage 301 with a conditional shut-off mechanism (not shown) and a static output stage 303.

The dynamic input stage 301 is coupled to receive a data signal D at an input lead 305 and to receive a clock signal CK at an input lead 307. The dynamic input stage 301 outputs at an output lead 309 an internal signal X. The static output stage 303 has an input lead 311 connected to the output lead 309 though which the static output stage 303 receives the internal signal X. The static output stage 303 is coupled to receive the clock signal CK at an input lead 313 and outputs an output signal Q at an output lead 315. In this embodiment, the flip-flop circuit 300 enters a precharge phase when the clock signal CK transitions to the logic low level and enters an evaluation phase when the clock signal CK transitions to the logic high level.

The flip-flop circuit 300 operates during the precharge phase as follows. The dynamic input stage 301 causes the internal signal X to be at a predetermined logic level, independent of the logic level of the data signal D. In this embodiment, the dynamic input stage 301 causes the signal X to be at a logic high level during the precharge phase for any logic level of the data input signal D. On the other hand, the static output stage 303 maintains the logic level of the output signal Q at the same logic level the output signal Q had during the previous evaluation phase, independent of the logic level of the received signal X.

The flip-flop circuit 300 operates during the evaluation phase as follows. The dynamic input stage 301 receives the data input signal D and, in response, causes the internal signal X to have a logic level dependent on the logic level of the data signal D. In this embodiment, the dynamic input stage 301 causes the internal signal X to be the complement of the data signal D. As described above, before the start of the evaluation phase, the dynamic input stage 301 precharges the internal signal X to a logic high level. Then, depending on the logic level of the data signal D at about the start of the evaluation phase, the dynamic input stage 301 causes the internal signal X to transition to a logic low level or else remain at the logic high level. In this embodiment, when the data signal D is at a logic high level at the initial portion of the evaluation phase, the dynamic input stage 301 causes the internal signal X to transition to a logic low level. Conversely, when the data signal D is at a logic low level at the initial portion of the evaluation phase, the dynamic input stage 301 causes the internal signal X to remain at a logic high level.

In addition, the dynamic input stage 301 is implemented so that once the internal signal X transitions to a logic low level during the evaluation phase, the dynamic input stage 301 cannot again cause the internal signal X to have a logic high level during the same evaluation phase.

Further, a shut-off mechanism (not shown) in the dynamic input stage 301 maintains the logic level of the internal signal X at a logic high level, if the logic level of the data signal D does not change to a logic high level within a relatively short time period (hold time) from the start of the evaluation phase (i.e., a short "window" after the rising edge of the clock signal CK). This short window gives the flip-flop circuit 300 an edge-triggered operation. Therefore, during an evaluation phase, the dynamic input stage 301 provides an internal signal X that either remains stable at a logic high level throughout the rest of the evaluation phase, or else transitions from a logic high level to a logic low level shortly after the rising edge of the clock signal CK, remaining stable at the logic low level throughout the rest of the evaluation phase.

In addition, the transition to the evaluation phase causes the static output stage 303 to generate the output signal Q having a logic level dependent on the logic level of the internal signal X from the dynamic input stage 301. In this embodiment, the static output stage 303 provides the output signal Q having a logic level that is the complement of the logic level of the internal signal X. Because the logic level of the internal signal X remains stable throughout the evaluation phase shortly after the rising edge of the clock signal CK, the static output stage 303 provides the output signal Q with a static logic level throughout the rest of the clock cycle.

Through the use of the dynamic input stage 301, the set-up time of the flip-flop circuit 300 is zero (i.e., the data signal D can arrive at the flip-flop circuit 300 at about the same time as the rising edge of the clock signal CK), thereby decreasing the latency of the flip-flop circuit 300. Further, because the dynamic input stage 301 causes the internal signal X to be initially at the predetermined logic level at the start of the evaluation phase, the dynamic input stage 301 can be optimized or "skewed" to more quickly cause the logic level of the internal signal X to change in response to the data input signal D. This "precharging" of the internal signal X also allows the static output stage 303 to be "skewed" to increase the speed of changing the logic level of the output signal Q caused by the internal signal X in changing from the predetermined logic level. Still further, only a single clock phase (i.e., clock signal CK) is required, unlike the two clock phases (e.g., clock signals CK and CKB) required by the aforementioned conventional flip-flop 100 (FIG. 1), thereby decreasing the complexity of the clock headers and decreasing the clock line loading. As a result, a circuit using the flip-flop circuit 300 can operate with a faster clock than is possible for a circuit using conventional static flip-flops.

Figure 4:
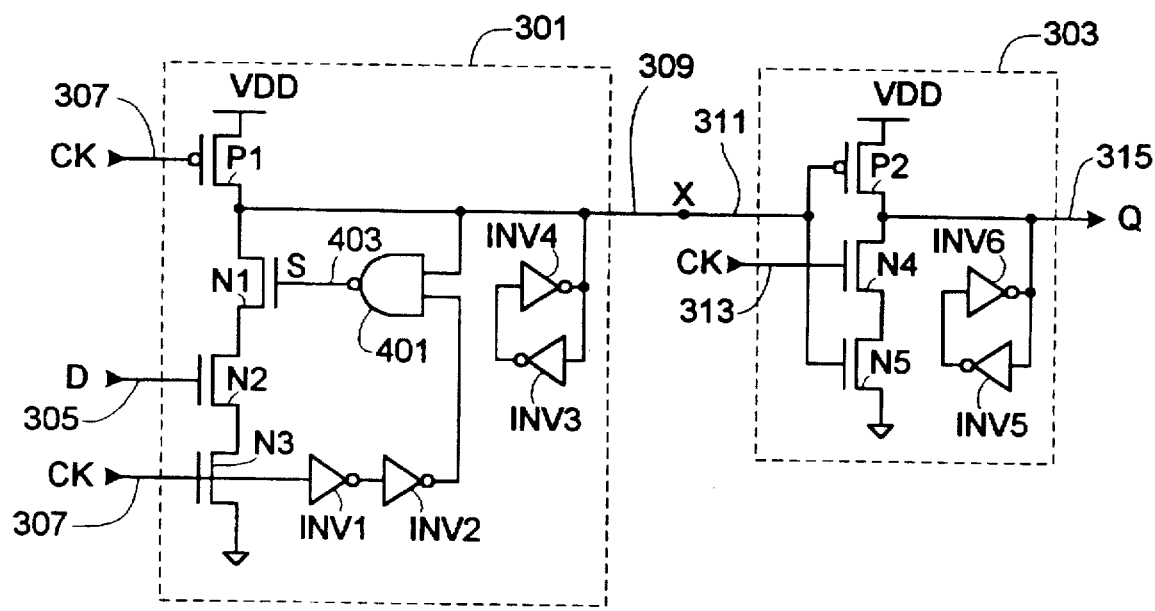
FIG. 4 is a schematic diagram of a staticized dynamic flip-flop implementing the block diagram of FIG. 3, according to one embodiment of the present invention.

FIG. 4 is a schematic diagram of a flip-flop circuit 400 implementing the block diagram of FIG. 3, according to one embodiment of the present invention. In this embodiment, the dynamic input stage 301 includes a p-channel transistor P1, n-channel transistors N1, N2 and N3, four inverters INV1–INV4 (the inverters INV3 and INV4 are connected "input lead-to-output lead" to form a static latch) and a two-input NAND gate 401.

The elements of the dynamic input stage 301 are interconnected as follows. The p-channel transistor P1 has a source coupled to a VDD voltage source (not shown), a gate connected to the clock input lead 307, and a drain connected to the drain of the n-channel transistor N1. The drain of the n-channel transistor N1 is also connected to the output lead 309, which propagates the internal signal X. The n-channel transistor N1 has a gate connected to an output lead 403 of the NAND gate 401 and a source connected to the drain of the n-channel transistor N2. The n-channel transistor N2 has a source connected to the drain of n-channel transistor N3 and a gate that receives data input signal D. N-channel transistor N3 has a gate connected to the clock input lead 307 and a source connected to a ground voltage source (not shown). The input lead of the inverter INV1 is connected to the clock input lead 307, while the output lead of the inverter INV1 is connected to the input lead of the inverter INV2. The output lead of the inverter INV2 is connected to one input lead of the NAND gate 401. The other input lead of the NAND gate 401 is connected to the output lead 309. The latch formed by the inverters INV3 and INV4 are connected to the output lead 309.

The static output stage 303 includes a p-channel transistor P2, two n-channel transistors N4 and N5, and two inverters INV5 and INV6. The p-channel transistor P2 has a source coupled to the VDD voltage source (not shown), a gate coupled to the output lead 309 of the dynamic input stage 301 through the input lead 311 of the static output stage 303. The drain of the p-channel transistor P2 is connected to the output lead 315, which propagates the output signal Q. The n-channel transistor N5 has a source connected to the ground voltage source (not shown), a gate connected to the input lead 311 and a drain connected to the source of the n-channel transistor N4. The n-channel transistor N4 has a gate connected to the clock input lead 313 and a drain connected to the output lead 513. The inverters INV5 and INV6 are connected "input lead-to-output lead" to form a conventional static latch. In addition, the output lead of the inverter INV6 is connected to the output lead 315 to latch the output signal Q.

Figure 5:
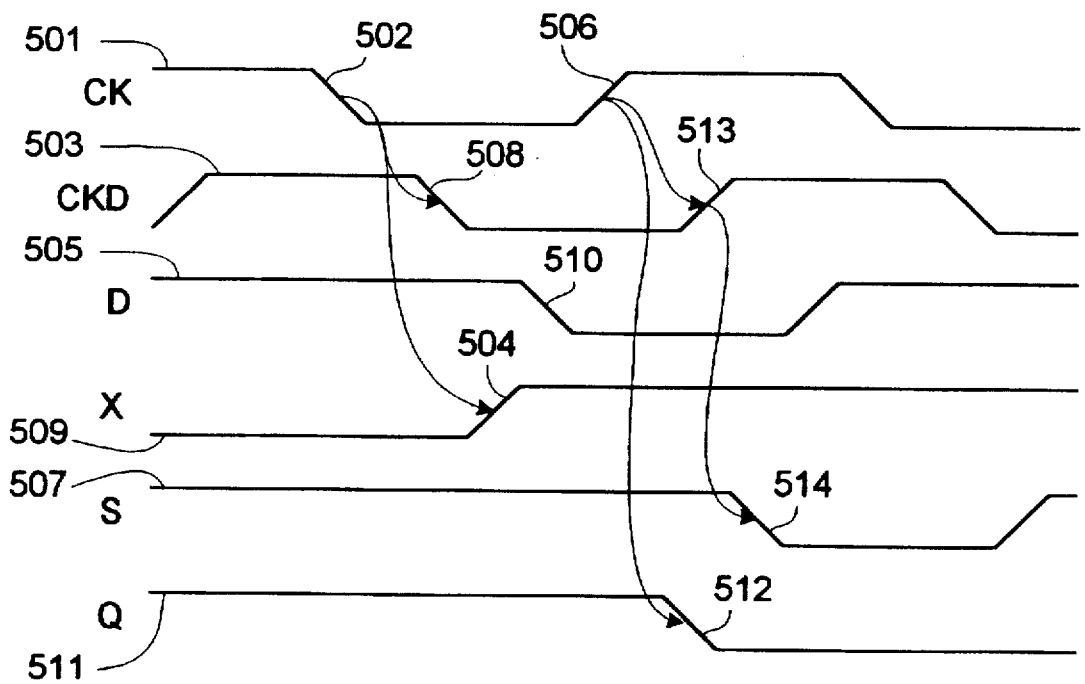
FIGS. 5 and 6 are timing diagrams illustrative of the operation of the staticized dynamic flip-flop depicted in FIG. 4.
Figure 6:
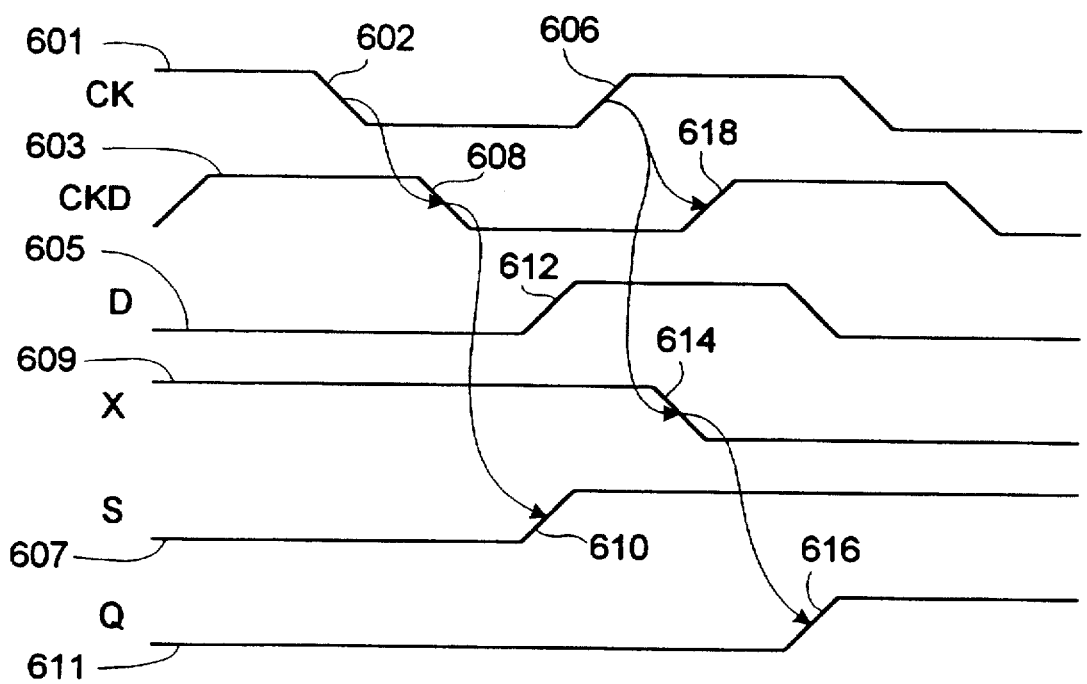

Because the input stage 301 is dynamic in nature, the flip-flop circuit 400 operates in a precharge phase and an evaluation phase. In this embodiment, the flip-flop circuit 400 is operating in the precharge phase when the clock signal CK is at a logic low level. Conversely, the flip-flop circuit 400 is operating in the evaluation phase when the clock signal CK is at a logic high level. The operation of the flip-flop circuit 400 is described below in conjunction with FIGS. 4–6. FIGS. 5 and 6 are timing diagrams illustrating the operation of the flip-flop circuit 400 for a high-to-low transition of the output signal Q and a low-to-high transition of the output signal Q, respectively.

Referring to FIGS. 4–5, the flip-flop circuit 400 performs a high-to-low transition of the output signal Q as follows. In this example, the logic high level of the output signal Q before the start of the precharge phase was achieved by having the data signal D at a logic high level at the start of the previous evaluation phase, which causes the internal signal X to transition to a logic low level (described below in conjunction with FIG. 6).

The flip-flop circuit 400 enters the precharge phase on the falling edge 502 of the clock signal CK, represented by the waveform 501 in FIG. 5. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off. Because the p-channel transistor P1 is on and the n-channel transistor N3 is off, the voltage of the internal signal X, represented by the waveform 509, is "pulled up" to a voltage of approximately equal to the voltage of the VDD voltage source (not shown) by the p-channel transistor P1, regardless of whether the n-channel transistor N2 is on or off. Thus, the internal signal X is "precharged" to about the voltage VDD independently of the logic level of the data signal D (which controls the n-channel transistor N2 to be on or off). Consequently, in this example, the internal signal X makes a low-to-high transition 504 after a short delay from the falling edge 502 in turning on the p-channel transistor P1.

The resulting logic high level of the internal signal X then turns off the p-channel transistor P2 and turns on the n-channel transistor N5. Because the n-channel transistor N4 is off, the output lead 315 is isolated from the dynamic input stage 301. Thus, the static latch formed by the inverters INV5 and INV6 causes the output signal Q, represented by the waveform 511 in FIG. 5, to maintain its logic high level from the previous evaluation phase.

The inverters INV1 and INV2 delay the clock signal CK to generate a delayed clock signal CKD, which is represented by the waveform 503 in FIG. 5. The inverters INV1 and INV2 are sized so that the low-to-high transition of the delayed clock signal CKD occurs slightly after the high-to-low transition of the internal signal X. After this two inverter delay, the falling edge 502 of clock signal CK causes the delayed clock signal CKD to have a falling edge 508. The NAND gate 401 receives the delayed clock signal CKD at one input lead, and outputs a shut-off signal S, represented by the waveform 507 in FIG. 5, to the gate of the n-channel transistor N1. The resulting logic low level of the delayed clock signal CKD causes the NAND gate 401 to output the shut-off signal S with a logic high level, thereby causing the n-channel transistor N1 to be turned on.

To effect the high-to-low transition of the output signal Q, the data signal D, represented by the waveform 505 in FIG. 5, transitions to a logic low level before the end of the precharge phase, as indicated by a falling edge 510 of the waveform 505. Although in this example the data signal D transitions to a logic low level before the end of the precharge phase, the flip-flop circuit 400 will also operate properly if the falling edge 510 of the data signal D occurs about coincidentally with the end of the precharge phase (i.e., the flip-flop circuit 400 has a set time of about zero).

On the rising edge 506 of the clock signal CK, the flip-flop enters the evaluation phase, turning off the p-channel transistor P1 and turning on the n-channel transistors N3 and N4. In addition, the logic low level of the data signal D turns off the n-channel transistor N2, thereby preventing the discharge of the output lead 309. As a result, the internal signal X remains at a logic high level due to the static latch formed by the inverters INV3 and INV4.

Because the logic high level of the internal signal X is maintained at during this evaluation phase, the n-channel transistor N5 remains turned on and the p-channel transistor P2 remains turned off. However, the rising edge 506 of the clock signal CK (i.e., the start of the evaluation phase) turns on the n-channel transistor N4, thereby allowing the n-channel transistor N5 to discharge the output lead 315. Because the output lead 315 is discharged, the output signal Q transitions from a logic high level to a logic low level, as indicated by the falling edge 512 of the waveform 511. Because the n-channel transistor N5 was already turned on at the start of the evaluation phase, this high-to-low transition of the output signal Q occurs after approximately one gate delay from the start of the evaluation phase.

Further, the rising edge 506 of the clock signal CK causes the delayed clock signal CKD to have a rising edge 513 after two short inverter delays. Because the internal signal X is already at a logic high level, the now logic high level of the delayed clock signal CKD causes the NAND gate 401 to output the shut-off signal S with a logic low level, as indicated by the falling edge 514 of the waveform 507. The resulting logic low level of the shut-off signal S causes the n-channel transistor N1 to turn off. This is referred to herein as the shut-off operation. The shut-off operation prevents a subsequent low-to-high transition of data signal D from discharging the internal signal X. Therefore, the delay of the inverters INV1 and INV2 pair plus the delay of the NAND gate 401, (referred to herein as the shut-off delay), determines the hold time of the flip-flop circuit 400 when the flip-flop circuit 400 latches a "zero".

Referring to FIGS. 4 and 6, the flip-flop circuit 400 performs a low-to-high transition of the output signal Q as follows. In this example, the logic low level of the output signal Q before the start of the precharge phase was achieved by having the data signal D at a logic low level at the start of the previous evaluation phase, which causes the internal signal X to be at a logic high level and the shut-off signal S to be at a logic low level (described above in conjunction with FIG. 5).

The flip-flop circuit 400 enters the precharge phase on the falling edge 602 of the clock signal CK, represented by the waveform 601 in FIG. 6. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off. Because the p-channel transistor P1 is on and the n-channel transistor N3 is off, the voltage of the internal signal X, represented by the waveform 609 in FIG. 6, is "pulled up" to approximately the VDD voltage by the p-channel transistor P1, independently of the logic level of the data signal D, represented by the waveform 605 in FIG. 6. Consequently, in this example, the internal signal X remains at a logic high level at the falling edge 602 of the clock signal CK and throughout the precharge phase.

The logic high level of the internal signal X keeps the p-channel transistor P2 turned off and the n-channel transistor N5 turned on. Because the n-channel transistor N4 is off, the output lead 315 is isolated from the dynamic input stage 301. Thus, the static latch formed by the inverters INV5 and INV6 causes the output signal Q, represented by the waveform 611 in FIG. 6, to maintain its logic low level from the previous evaluation phase.

The inverters INV1 and INV2 delay the clock signal CK to generate the delayed clock signal CKD, which is represented by the waveform 603 in FIG. 6. The falling edge 602 of clock signal CK causes the delayed clock signal CKD to have a falling edge 608 after a relatively short two inverter delay. The NAND gate 401 receives the delayed clock signal CKD at one input lead, and outputs the shut-off signal S, represented by the waveform 607 in FIG. 6, to the gate of the n-channel transistor N1. The resulting logic low level of the delayed clock signal CKD causes the NAND gate 401 to output the shut-off signal S with a low-to-high transition 610, thereby causing the n-channel transistor N1 to be turned on.

To effect the low-to-high transition of the output signal Q, the data signal D transitions to a logic high level before the end of the precharge phase, as indicated by a rising edge 612 of the waveform 605. Although in this example the data signal D transitions to a logic low level before the end of the precharge phase, the flip-flop circuit 400 will also operate properly if the rising edge 612 occurs coincident with or even slightly after the end of the precharge phase.

On the rising edge 606 of the clock signal CK, the flip-flop enters the evaluation phase, turning off the p-channel transistor P1 and turning on the n-channel transistors N3 and N4. In addition, the now logic high level of the data signal D turns on the n-channel transistor N2. Because the NAND gate 401 already turns on N1 the n-channel transistor, the output lead 309 is discharged through the n-channel transistors N1–N3. As a result, the internal signal X transitions to a logic low level after a relatively short gate delay, as indicated by the falling edge 614 of the waveform 609.

Because of the logic low level of the internal signal X, the n-channel transistor N5 is turned off and the p-channel transistor P2 is turned on. Because the n-channel transistor N5 is turned off, the p-channel transistor P2 pulls up the voltage of the output lead 315, thereby causing the output signal Q to transition from a logic low level to a logic high level, as indicated by the rising edge 616 of the waveform 611. This low-to-high transition of the output signal Q occurs after approximately one gate delay from the falling edge 614.

Further, the rising edge 606 of the clock signal CK causes the delayed clock signal CKD to have a rising edge 618 after two short inverter delays. Because the internal signal X is already at a logic low level, the now logic high level of the delayed clock signal CKD does not cause the NAND gate 401 to change the logic level of the shut-off signal S. However, because the p-channel transistor P1 is off, once discharged, the output lead 309 cannot again be charged during this evaluation phase even if the data signal D were to transition again to a logic low level. The latch formed by the inverters INV3–INV4 prevents the voltage of the output lead 309 from floating, maintaining the internal signal X at a logic low level. This operation provides part of the edge-triggered operation of the flip-flop circuit 400.

As described above, the high-to-low transition of the internal signal X forces the shut-off signal S to remain high, thus preventing the shut-off of transistor N1. The two inverters INV1 and INV2, in effect, prevent the early shut-off of the n-channel transistor N1, since the rising edge 618 of the delayed clock signal CKD arrives about one gate delay after the falling edge 614 of the internal signal X.

It should be noted that if the output signal Q was previously held at a logic high level, a glitch appears as a consequence of the n-channel transistors N4 and N5 both being simultaneously on for a short interval (until the internal signal X transitions to a logic low level). However, this glitch is small and has no significant effect on the operation of the flip-flop circuit 400 because the output signal Q is driven high by the p-channel transistor P2 within about a gate delay from the falling edge 614 of the internal signal X.

The conditional shut-off mechanism provides several advantages in the operation of the flip-flop circuit 400. As described above, the shut-off operation is conditioned to the state of the input. Thus, when latching a zero, the n-channel transistor N1 is shut-off after a short delay. Conversely, when latching a one, the internal signal X is driven low, causing the n-channel transistor N1 to remain turned on during the rest of the clock cycle. Because the pull-down path for the dynamic input stage 301 is not cut off by the shut-off mechanism during the discharge of the output lead 309, the flip-flop circuit 400 is robust across process variations. More specifically, because the n-channel transistor N1 remains on, the shut-off mechanism causes no significant impact on the forward delay of the flip-flop when latching a one. This feature makes possible a flip-flop design with a shorter shut-off delay, or correspondingly, a shorter hold time. If an unconditional mechanism were used, then the delay would need to be increased to ensure across process variations that the pull down path is not cut off before the output lead 309 is fully discharged. A short shut-off delay also means that the input sampling window is narrow, a feature that improves the noise immunity of the circuit. Due to the shut-off operation, input data is only sampled during the short time interval elapsed between the rising edge of the clock signal CK and the falling edge of the shut-off signal S (i.e., the shut-off delay). As is well known, shortening the sampling window improves the noise rejection threshold. Thus, this short sampling window significantly improves the input noise immunity of the flip-flop circuit 400, thereby providing a noise rejection threshold comparable to a fully static design. Note that if the power supply voltage level were increased (i.e., making input noise more severe), the inverters INV1 and INV2 would operate faster, thereby causing the sampling window to be reduced due to a shorter shut-off delay. This results in a noise rejection threshold that virtually tracks the power supply voltage level and, also, process and temperature changes, thereby adding robustness and process independence to the design.

During the logic low period of the clock signal CK, the flip-flop circuit 400 can be sensitive to output noise. This noise sensitivity can arise because the transistors P2 and N4 are both off and inverter INV6 is designed to operate as a weak "keeper". Making the inverter INV6 "strong" (i.e., having a larger width-to-length ratio) in order to better hold the output signal Q would degrade the performance of the flip-flop circuit 400, because the inverter INV6 would "fight" the flip-flop's output driver (i.e., transistors P2, N4 and N5). Therefore, this circuit can be advantageously used in applications with relatively low output noise level, (e.g., when the output leads of the flip-flop are fully shielded).

Figure 7:
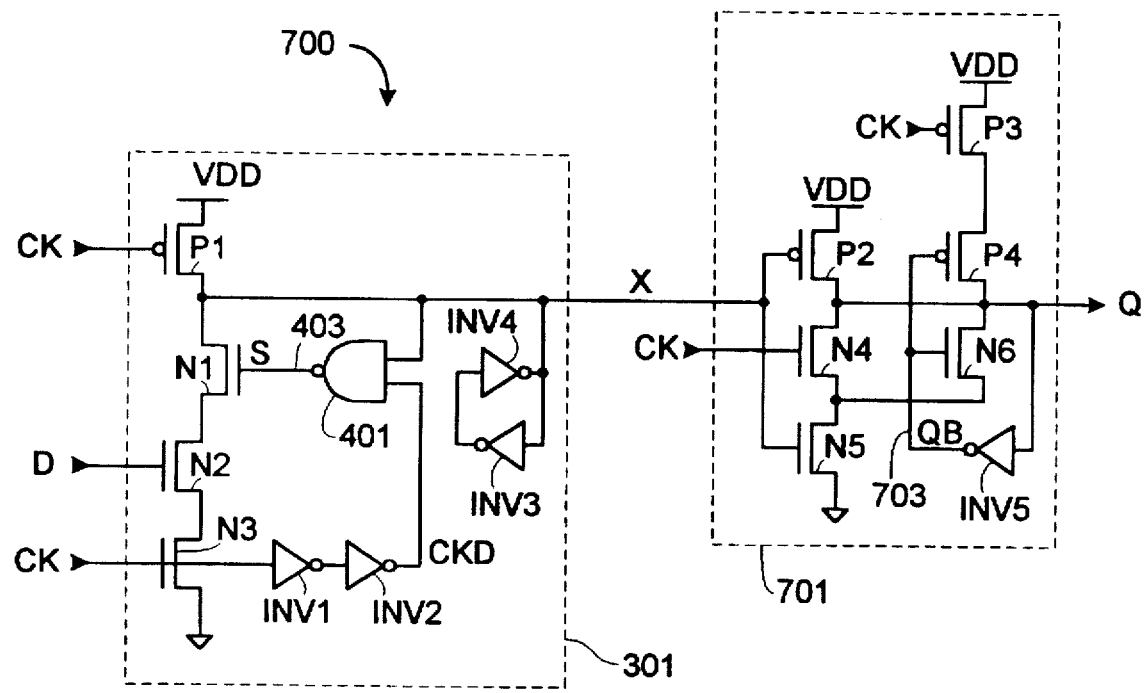
FIG. 7 is a schematic diagram of a staticized dynamic flip-flop implementing the block diagram of FIG. 3, according to another embodiment of the present invention.

FIG. 7 schematically illustrates a flip-flop circuit 700 according to another embodiment of the present invention. The flip-flop circuit 700 is substantially similar to the flip-flop circuit 400 (FIG. 4) except that the flip-flop circuit 700 includes an output stage 701 with improved output noise immunity instead of the output stage 303 (FIG. 4). The output stage 701 is similar to the output stage 303 except that the weak feedback inverter INV6 is replaced with a n-channel transistor N6 and p-channel transistors P3 and P4. These three transistors implement a strong feedback circuit that is active only during the precharge phase.

The transistors N6, P3 and P4 are interconnected in the output stage 701 as follows. The p-channel transistor P3 has a source connected to a VDD voltage source (not shown), a gate connected to receive the clock signal CK, and a drain connected to a source of the p-channel transistor P4. The p-channel transistor P4 has a drain connected to the output lead 315 and a gate connected to the output lead 703 of the inverter INV5. The n-channel transistor N6 has a drain are connected to the output lead 315, a gate connected to the output lead 703 and a source connected to the drain of the n-channel transistor N5.

The output stage 701 operates as follows. On the rising edge of the clock signal CK, when the flip-flop circuit 700 enters the evaluation phase, the p-channel transistor P3 is turned off, thus preventing the p-channel transistor P4 from conducting. If the internal signal X is driven low during this period, the p-channel transistor P2 is turned on and the n-channel transistor N5 is turned off, thereby driving the output signal Q to a logic high level. As a result, the inverter INV5 generates a complemented output signal QB with a logic low level, turning off the n-channel transistor N6 and turning on the p-channel transistor P4. Although the n-channel transistor N6 is turned off after one inverter delay (from the inverter INV5), there is no fight with the p-channel transistor P2 because the n-channel transistor N5 has been turned off by the internal signal X. Thus, during the subsequent precharge phase, the conductive p-channel transistors P3 and P4 help maintain the logic high level of the output signal Q in the presence of noise on the output lead 315.

Conversely, if the internal signal X remains at a logic high level during the evaluation phase, the output signal Q will be driven low when the n-channel transistor N4 is turned on and the p-channel transistor P3 is turned off by the logic high level of the clock signal CK. Consequently, the inverter INV5 drives the complemented output signal QB to a logic high level, turning on the n-channel transistor N6 and turning off the p-channel transistor P4. On the falling edge of the clock signal CK, the flip-flop circuit 700 enters the precharge phase and the internal signal X is driven to a logic high level, turning on the n-channel transistor N5 and turning off the p-channel transistor P2. Because the n-channel transistors N5 and N6 are turned on while the p-channel transistor P4 is turned off, the feedback circuit is active. More specifically, the n-channel transistors N5 and N6 pull down the voltage of the output lead 315, thereby helping to hold the logic low level of the output signal Q in the presence of noise on the output lead 315. As described above, the output stage 701 implements a strong feedback circuit which is active only during the logic low period of the clock signal CK (i.e., the precharge phase). The strong feedback circuit holds the output signal Q better and fights noise. During the evaluation phase, the feedback circuit is deactivated so the forward delay of the flip-flop circuit 700 is not increased.

Figure 8:
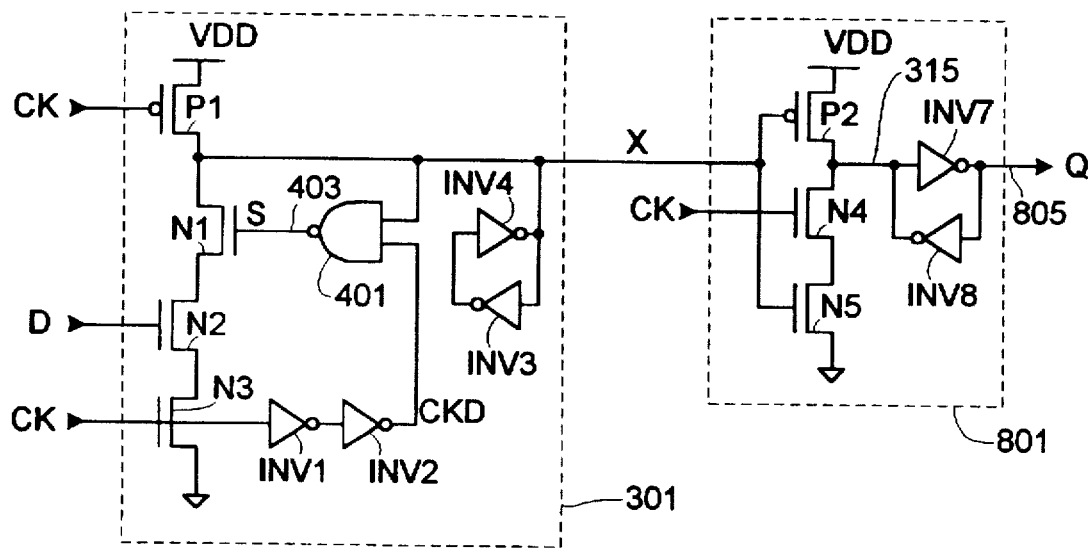
FIG. 8 is a schematic diagram of a staticized dynamic flip-flop implementing the block diagram of FIG. 3, according to still another embodiment of the present invention.

FIG. 8 schematically shows a flip-flop circuit 800 with improved output noise immunity, according to a third embodiment of the present invention. The flip-flop circuit 800 is substantially similar to the flip-flop circuit 400 (FIG. 4) except that an output stage 801 replaces the output stage 303 (FIG. 4). In addition, the flip-flop circuit 800 outputs a complemented output signal QB instead of the "true" output signal Q. Because only the output stage is modified, the input stage 301 operates as described above in conjunction with FIGS. 4–6.

The output stage 801 is similar to the output stage 303 except that static latch implemented by the inverters INV5 and INV6 are replaced by inverters INV7 and INV8. In this embodiment, the inverter INV7 is a strong inverter and is used as an output driver. The inverters INV7 and INV8 are interconnected in the output stage 801 as follows. The inverter INV7 has an input lead connected to the output lead 315 and an output lead connected to the flip-flop circuit output lead 805. Thus, the flip-flop circuit outputs the complemented output signal QB. The inverter INV8 has an input lead connected to the output lead 805 and an output lead connected to the output lead 315.

Consequently, at the start of the evaluation phase, the input stage 301 samples the data signal D. When the data signal D is sampled while at a logic low level, the conditional shut-off mechanism turns off the n-channel transistor N1 to prevent the internal signal X from changing to a logic low level, as described above in conjunction with FIGS. 4 and 5. The logic high level of the internal signal X then causes the output stage 801 to output the signal QB with a logic high level. Accordingly, the flip-flop circuit 800 latches a "one" when the path between the drain of the n-channel transistor N3 and the source of the n-channel transistor N1 is open circuited.

Conversely, when the data signal D is sampled while at a logic high level, a conductive path is formed between the source of the n-channel transistor N1 and the drain of the n-channel transistor N3. Therefore, the voltage level of the internal signal X is pulled down to a logic low level. In response, the output stage 801 causes the output signal QB to be at a logic low level. Thus, the flip-flop circuit 800 latches a "zero" when a conductive path is formed between the source of the n-channel transistor N1 and the drain of the n-channel transistor N3.

Although this scheme increases the latency of the flip-flop circuit 800 relative to the flip-flop circuit 700 (FIG. 7) by adding one inverter delay, the entire flip-flop circuit is more robust, still fast, and presents less clock load compared to the flip-flop circuit 700. The inverter INV7 also contributes to filter out the glitch (described above in conjunction with FIGS. 4 and 6) in the output signal Q when the output signal Q is at a logic high level and the flip-flop circuit 400 samples a logic "one" data signal D.

Figure 9:
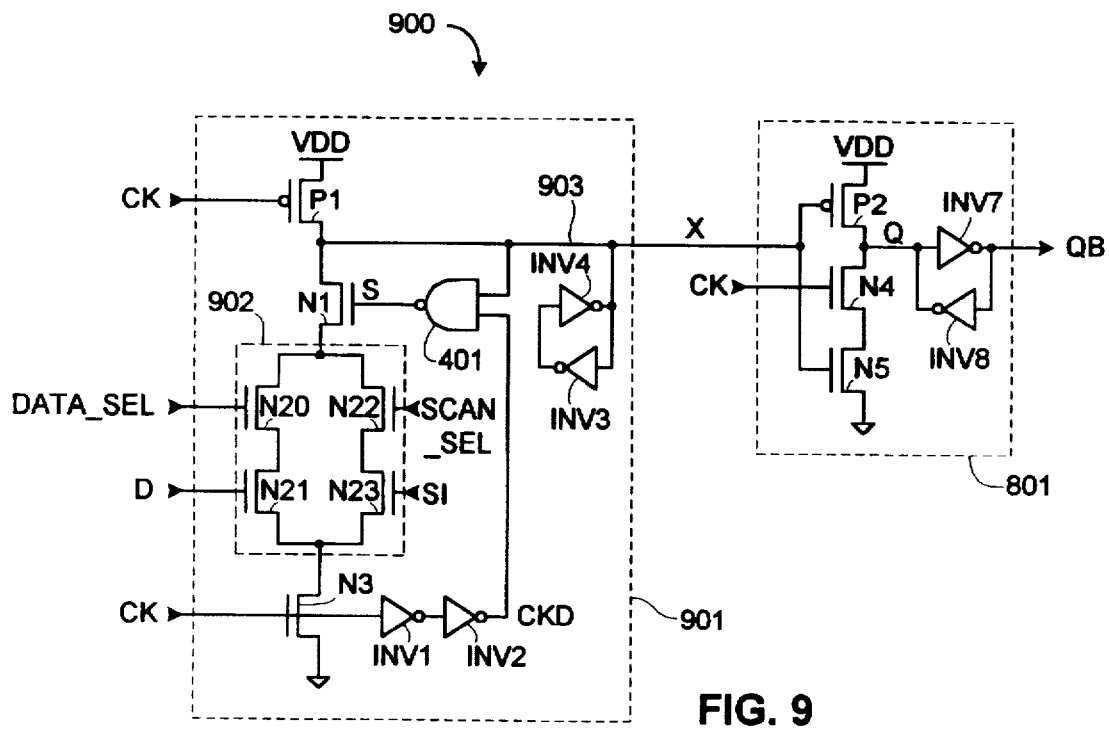
FIG. 9 is a schematic diagram of a flip-flop with scan circuitry, according to one embodiment of the present invention.

FIG. 9 is a schematic diagram of a flip-flop circuit 900 with scan circuitry, according to one embodiment of the present invention. The flip-flop circuit 900 is similar to the flip-flop circuit 800 (FIG. 8) except that the flip-flop circuit 900 has an input stage 901 instead of the input stage 301 (FIG. 8). In particular, the n-channel transistor N2 (FIG. 8) is replaced with an n-channel logic block 902. The n-channel logic block 902 implements a two-input multiplexer to provide the scan capability. The n-channel logic block or multiplexer 902 includes four n-channel transistors N20–N23. The n-channel transistors N20 and N22 have their sources connected to the drain of the n-channel transistor N3 and their gates respectively connected to receive the select signals DATA_SEL and SCAN_SEL. The n-channel transistors N21 and N23 have their sources respectively connected to the drains of the n-channel transistors N20 and N22, and have their drains connected to the source of the n-channel transistor N1. The gates of the n-channel transistors N21 and N23 are respectively connected to receive input signals D and SI. The use of the NMOS logic block avoids the need for pull-up transistors in the multiplexing operation. Thus, there is no contention problem if the select signals cause more than one data signal to be selected. Stated another way, the select signals DATA_SEL and SCAN_

SEL need not be mutually exclusive, although these select signals are generally mutually exclusive.

The flip-flop circuit 900 operates in a manner similar to the flip-flop circuit 800 described above in conjunction with FIG. 8, except that the multiplexer 902 replacing the n-channel transistor N2 (FIG. 8) is used for selecting the input signal to be sampled and stored in the flip-flop circuit. The multiplexer 902 is used to configure the flip-flop circuit 900 into either the "normal" or "scan" mode. In particular, the multiplexer 902 selects between the two signals D and SI in response to the select signals SCAN_SEL and DATA_SEL. In this embodiment, the select signals DATA_SEL and SCAN_SEL are constrained to have complementary logic levels. Thus, when the select signals DATA_SEL and SCAN_SEL are respectively at logic high and logic low levels when the evaluation phase begins, the n-channel transistors N20 and N22 are respectively turned on and off, thereby "selecting" the data signal D. The input stage 901 then samples the data signal D as described above in conjunction with FIGS. 4–6. Conversely, when the select signals DATA_SEL and SCAN_SEL are respectively at logic low and logic high levels when the evaluation phase begins, the n-channel transistors N20 and N22 are respectively turned off and on, allowing the scan input signal SI to be selected.

As described above in conjunction with FIGS. 4–6, if the selected input signal is at a logic high level (i.e., a "one") when sampled, (i.e., when the evaluation phase begins), the n-channel transistor receiving the selected input signal will be turned on, thereby providing a conductive path between the source of the n-channel transistor N1 and the drain of the n-channel transistor N3. When the NMOS logic block 902 provides such a conductive path, the output stage 801 of the flip-flop circuit 900 latches a "zero", thereby outputting the signal QB to be equivalent to the complement of the sampled input signal, as described above in conjunction with FIG. 8.

Conversely, if the selected data signal is at a logic low level (i.e., a "zero") when sampled at the start of an evaluation phase, then the n-channel transistor receiving the selected data signal is turned off, the input stage 301 maintains the internal signal X at a logic high level, as described above in conjunction with FIGS. 4 and 5. When the internal signal X is maintained at a logic high level through the evaluation phase, the output stage 801 of the flip-flop circuit 900 latches a "one", thereby outputting a signal equivalent to the complement of the sampled input signal.

By adding only three more n-channel transistors, the flip-flop circuit 800 (FIG. 8) is modified into the scan flip-flop circuit 900. Thus, the speed and size advantages of the original flip-flop circuit (described further in the Performance section below) are maintained, except for the slight speed penalty that can be incurred when the input stage 901 is sampling a logic high level input signal. This penalty can result from the extra series n-channel device in the pull down path of the dynamic input stage (i.e., either n-channel transistor N20 or N22, depending on the mode).

Figure 10:
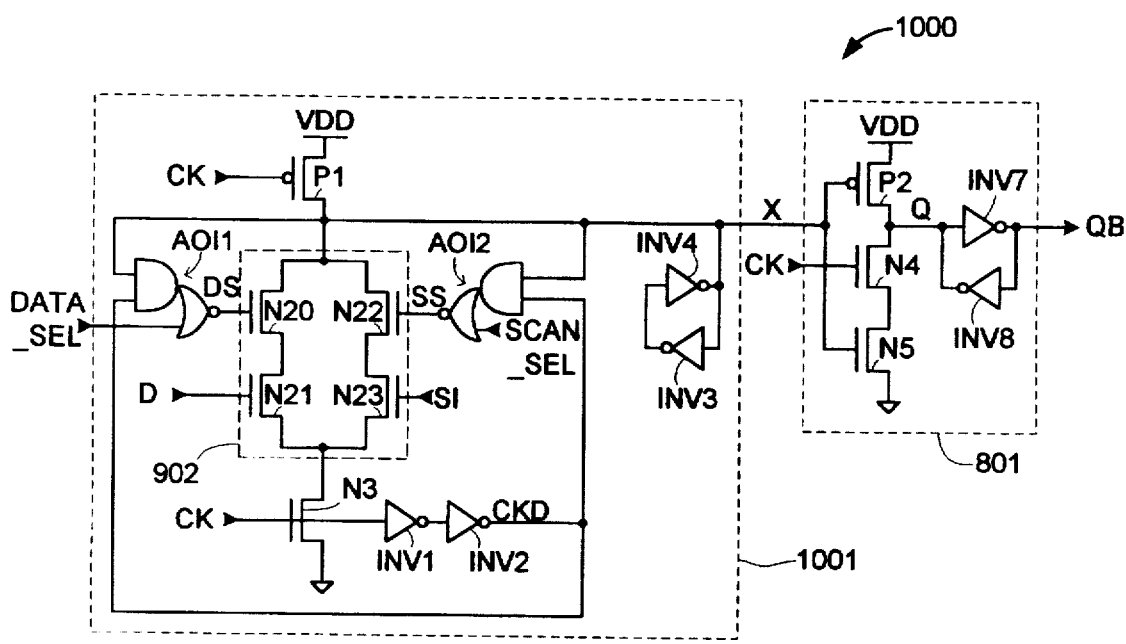
FIG. 10 is a schematic of a diagram of a flip-flop with scan circuitry according to a second embodiment of the present invention.

FIG. 10 is a schematic of a diagram of a flip-flop circuit 1000 with scan circuitry according to another embodiment of the present invention. The flip-flop circuit 1000 is similar to the flip-flop circuit 900 (FIG. 9), except that the input stage 901 (FIG. 9) is replaced with an input stage 1001. More specifically, the n-channel transistor N1 and the NAND gate 401 (FIG. 9) are replaced with AOI (AND-OR-INVERT) gates AOI1 and AOI2. In particular, the drains of the n-channel transistors N20 and N22 of the multiplexer 902 are connected to the drain of the p-channel transistor P1. The gates of the n-channel transistors N20 and N22 are respectively connected to the output leads of the gates AOI1 and AOI2. The two AND gate input leads of the gate AOI1 (and AOI2 also) are connected to receive the internal signal X and the delayed clock signal CKD. The NOR gate input lead of the gate AOI1 is connected to receive a select signal DATA_SELB (i.e., the complement of the aforementioned DATA_SEL signal), whereas the NOR gate input lead of the gate AOI2 is connected to receive the select signal SCAN_SELB (i.e., the complement of the aforementioned SCAN_SEL signal).

The circuit operates as follows. In the "normal" mode, during the precharge phase, the scan flip-flop circuit 1000 operates in a substantially similar manner as the scan flip-flop circuit 900 (FIG. 9). In particular, the p-channel transistor P1 is on and the n-channel transistor N3 is off, thereby allowing the p-channel transistor P1 to pull up the voltage of the internal signal X to a logic high level. Of course, this operation occurs in the "scan" mode precharge phase as well.

Then in the "normal" mode evaluation phase, the signals SCAN_SELB and DATA_SELB are set to logic high and logic low levels, respectively. The logic high level of the SCAN_SELB signal causes the gate AOI2 to output a logic low level, thereby turning off the n-channel transistor N22. As a result, the "scan" pull down path (i.e., n-channel transistors N22 and N23) is disabled. However, the logic low level of the DATA_SELB signal causes the gate AOI1 to function in a manner that is equivalent to a NAND gate. Thus, the gate AOI1 serves as an equivalent to the NAND gate 401 (FIG. 9) while the n-channel transistor N22 serves as the n-channel transistor N1 (FIG. 9). Accordingly, the "data" pull down path (i.e., n-channel transistors N20 and N21) of the n-channel logic block 902 is controlled as described above in conjunction with FIG. 9.

Conversely, in the "scan" mode evaluation phase, the signals SCAN_SELB and DATA_SELB are set to logic low and logic high levels, respectively. The logic high level of the DATA_SELB level causes the gate AOI1 to output a logic low level, thereby turning off the n-channel transistor N20. As a result, the "data" pull down path (i.e., n-channel transistors N20 and N21) is disabled. However, the logic low level of the SCAN_SELB signal causes the gate AOI2 to function in a manner that is equivalent to a NAND gate. Thus, the gate AOI2 serves as an equivalent to the NAND gate 401 (FIG. 9) while the n-channel transistor N22 serves as the n-channel transistor N1 (FIG. 9). Accordingly, the "scan" pull down path (i.e., n-channel transistors N20 and N21) of the n-channel logic block 902 is controlled as described above in conjunction with FIG. 9. Thus, while the scan flip-flop circuit 1000 requires more devices than the scan flip-flop circuit 900, no extra devices are added to the pull down paths of the input stage, thereby minimizing the speed penalty of the added scan circuitry. Although the AOI gates increase the capacitive load at the node propagating the internal signal X, the added delay is relatively small because the AOI gate can be built using minimum size devices.

Performance

Figure 1:
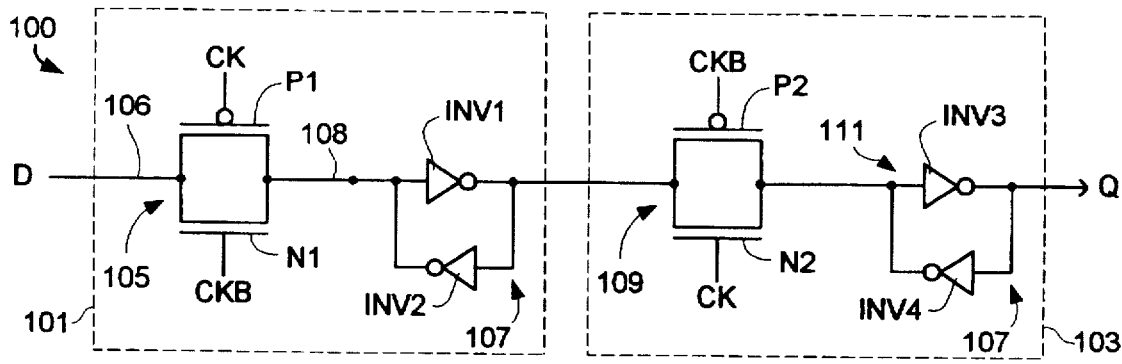
FIG. 1 is a schematic diagram of a conventional master-slave rising edge triggered static flip-flop.
Figure 1A:
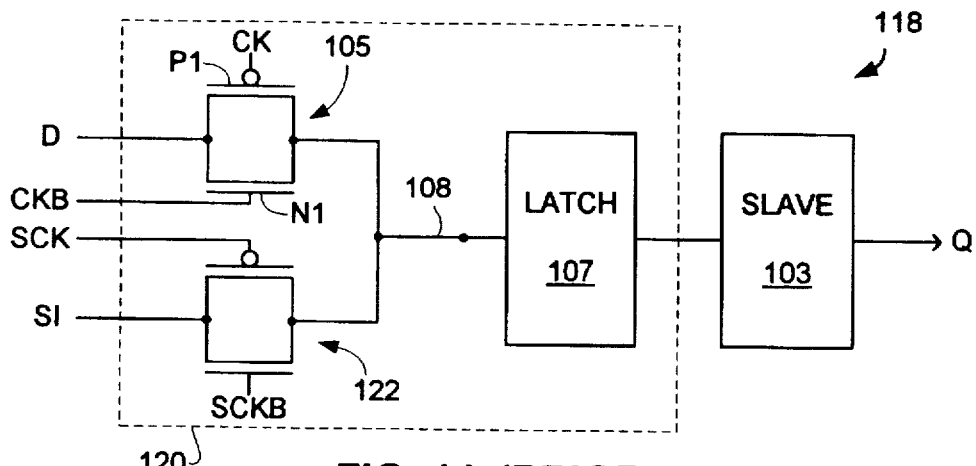
FIG. 1A is a schematic diagram of a conventional scan master-slave flip-flop.

The embodiment shown in FIG. 4 is fast for several reasons. First, the setup time is zero. The data signal D can arrive simultaneously with the rising edge of the clock signal CK. Second, because the input stage 301 is dynamic, there is no complementary PMOS device and, thus, less parasitic capacitance at the lead 309 and no fight during evaluation. Both of these factors contribute to speeding up of the circuit when latching a logic "one". For the same reason, the output stage 303 can be "skewed" in one direction to further speed up the delay of the circuit when latching a logic "one". For example, the output stage 303 can use a relatively large p-channel transistor P2 and relatively small n-channel transistors N4 and N5. While this action would affect the transition in the opposite direction, latching a logic "zero" is still faster because this transition requires only one gate delay. Thus, the total worst case latency (when latching a logic "one") of the circuit is given by two "skewed" gate delays, which is nearly twice as fast as the conventional static flip-flip 100 (FIG. 1). The flip-flop circuit 800 (FIG. 8), despite the addition of one inverter delay, is still approximately 33% faster than the conventional static flip-flop.

The hold time of the flip-flop circuit 400 when latching a logic "zero" is limited to three gate delays (i.e., two inverters plus a NAND gate). Because of the conditional shut-off mechanism, these gates can be highly skewed, resulting in a shorter hold time approximately equal to one unskewed gate delay. On the other hand, the hold time when latching a logic "one" is established by the time required to discharge the output lead 309, which is approximately one gate delay.

Although requiring more devices, the flip-flop circuit 400 is smaller (e.g., about half the size) than the conventional static flip-flop 100 (FIG. 1). This smaller size is achieved because many of the devices needed in the flip-flop circuit 400 are minimum sized devices, whereas relatively large transmission gates are required in the conventional flip-flop 100. In addition, the flip-flop circuit 400 presents approximately half the clock load of the conventional static flip-flop because no complementary devices are used to receive the clock signal. This factor significantly reduces clock power, simplifies the clock header (because only one clock phase is needed), and simplifies the clock distribution network. The circuit also presents nearly zero data-dependent gate capacitance variations seen by the clock header, which helps to minimize the clock skew. Further, the flip-flop circuit 400 dissipates about the same amount of power as the conventional static flip-flop 100, taking into consideration the power dissipation of clock signal and data signal drivers.

The above description of the performance of the flip-flop circuit 400 applies in general to the flip-flop circuits 700, 800, 900 and 1000 described in conjunction with FIGS. 7–10. Of course, in the flip-flop circuit 1000, the hold time when latching a logic "zero" is equivalent to the sum of the delays of two inverters and an AOI gate.

The embodiments of the staticized dynamic flip-flop described above are illustrative of the principles of this invention and are not intended to limit the invention to the particular embodiments described. For example, the input stages 901 and 1001 may be combined with output stages 701 or 801 to form other embodiments. In addition, those skilled in the art of flip-flops can implement an NMOS (or other transistor technology) embodiment in view of this disclosure without undue experimentation. Those skilled in the art of flip-flops can also implement a "complementary" embodiment, in which the flip-flop circuit has "series" p-channel devices and n-channel "hold" devices. Further, relatively simple logic functions can be placed inside the static flip-flop circuit in other embodiments. Thus, for example, a two-input NAND gate or an exclusive-OR logic function can be implemented. Accordingly, while the preferred embodiment of the invention has been illustrated and described, it will be appreciated that in view of the present disclosure, various changes can be made therein without departing from the spirit and scope of the invention.

The embodiments of the invention in which an exclusive property or privilege is claimed are defined as follows:

1. A scan flip-flop circuit configured to operate in a first phase and a second phase, said circuit comprising:
   a first stage having a data input lead, a scan input lead, a clock input lead and a first node, said data input lead being coupled to receive a data signal, said scan input lead coupled to receive a scan input signal and said clock input lead coupled to receive a clock signal, wherein:
   during said first phase, said first stage is operative to provide at said first node a node signal at a predetermined logic level,
   during said second phase, said first stage is operative to provide at said first node said node signal having a logic level that is determined as a function of a logic level of said data signal received at said data input lead when said circuit is in a data mode, and
   during said second phase, said first stage is operative to provide at said first node said node signal having a logic level that is determined as a function of a logic level of said scan signal received at said scan input lead when said circuit is in a scan mode; and
   a second stage having a first input lead coupled to said first node, a second clock input lead coupled to said clock input lead of said first stage, and an output lead, wherein:
   during said first phase, said second stage is operative to maintain at said output lead of said second stage an output signal generated by said second stage prior to said first phase, said second stage maintaining said output signal of said second stage independently of said node signal provided by said first stage during said first phase, and
   during said second phase, said second stage is operative to provide at said output lead of said second stage an output signal as a function of a logic level of said node signal provided by said first stage during said second phase,
   wherein said first stage includes a shut-off mechanism for maintaining said first node at said predetermined logic level independently of logic levels of said data signal and said scan input signal, said shut-off mechanism also being configured to maintain, during said second phase, said first node at said predetermined logic level when said logic levels of said data signal and said scan input signal remain unchanged during a shut-off delay, said shut-off delay having a predetermined time period starting when said second phase starts.

2. The circuit of claim 1, wherein said first stage further comprises a latch circuit coupled to said first node, said latch circuit being configured to maintain said node signal at said predetermined logic level during said second phase when said data signal is at a logic level different from said predetermined logic level.

3. The circuit of claim 2, wherein said latch circuit further comprises a third inverter having an input lead coupled to said first node and a fourth inverter having an input lead coupled to an output lead of the third inverter and having an output lead coupled to said first node.

4. The circuit of claim 2, wherein said latch circuit is configured to maintain said node signal at a logic level different from said predetermined logic level during said second phase when said data signal is at a logic level equivalent to said predetermined logic level.

5. The circuit of claim 1, wherein said clock signal is a single clock phase.

6. The circuit of claim 1, wherein said first stage further comprises:

a first transistor having a first lead coupled to said clock input lead;

a second transistor having a first lead coupled to a second lead of said first transistor and to said first node of said first stage;

a third transistor having a first lead coupled to said data input lead and having a second lead coupled to a second lead of said second transistor;

a fourth transistor having a first lead coupled to said clock input lead and having a second lead coupled to a third lead of said third transistor;

a fifth transistor having a first lead coupled to said second lead of said first transistor;

a sixth transistor having a first lead coupled to said scan input lead and having a second lead coupled to a second lead of said fifth transistor; and wherein said shut-off mechanism comprises:

a first inverter having an input lead coupled to said clock input lead of said first stage;

a second inverter having an input lead coupled to an output lead of said first inverter;

a first logic circuit having a first input lead coupled to said first node, a second input lead coupled to an output lead of said second inverter, a third input lead coupled to receive a first select signal, and an output lead coupled to a third lead of said second transistor; and a second logic circuit having a first input lead coupled to said first node, a second input lead coupled to said output lead of said second inverter, a third input lead coupled to receive a second select signal, and an output lead coupled to a third lead of said fifth transistor.

7. The circuit of claim 6 wherein said first logic circuit is an AND-OR-INVERT logic circuit.

8. The circuit of claim 6 wherein said second logic circuit is an AND-OR-INVERT logic circuit.

9. The circuit of claim 6 wherein said first and second select signals are respectively at logic low and logic high levels during said data mode.

10. The circuit of claim 6, wherein said first and second select signals are respectively at logic high and logic low levels during said scan mode.

11. The circuit of claim 6, wherein said second, third, fifth and sixth transistors are NMOS transistors.

12. The circuit of claim 6, wherein said predetermined time period is equivalent to a sum of two inverter delays and a delay associated with one of the first logic circuit and the second logic circuit.

13. A scan flip-flop circuit configured to operate in a first phase and a second phase, said circuit comprising:

a first stage having a data input lead, a scan input lead, a clock input lead and a first node, said data input lead being coupled to receive a data signal, said scan input lead coupled to receive a scan input signal and said clock input lead coupled to receive a clock signal, and a second stage having a first input lead coupled to said first node, a second clock input lead coupled to receive said clock signal, and an output lead, wherein said first stage includes a shut-off mechanism for maintaining said first node at a predetermined logic level independently of logic levels of said data signal and said scan input signal, said shut-off mechanism also being configured to maintain, during said second phase, said first node at said predetermined logic level when said logic levels of said data signal and said scan input signal remain unchanged during a shut-off delay, said shut-off delay having a predetermined time period starting when said second phase starts.

14. The circuit of claim 13, wherein said predetermined time period is equivalent to a sum of two inverter delays and a NAND gate delay.

15. The circuit of claim 13, wherein, during said second phase, said shut-off mechanism is configured to maintain a conductive path between said first node and a voltage source in response to said data signal being at a preselected logic level when said second phase begins and to interrupt said conductive path when said data signal is not at said preselected logic level when said second phase begins.

16. The circuit of claim 13, wherein, during said second phase, when said first stage provides said node signal with a logic level different from said predetermined logic level, said first stage is configured to maintain said logic level of said node signal throughout said second phase.

17. A scan flip-flop circuit configured to operate in a first phase and a second phase, said circuit comprising:

a first stage having a data input lead, a scan input lead, a clock input lead and a first node, said data input lead being coupled to receive a data signal, said scan input lead coupled to receive a scan input signal and said clock input lead coupled to receive a clock signal, and a second stage having a first input lead coupled to said first node, a second clock input lead coupled to receive said clock signal, and an output lead, wherein said first stage comprises:

a first transistor having a first lead coupled to said clock input lead;

a second transistor having a first lead coupled to a second lead of said first transistor and said first node of said first stage;

a third transistor having a first lead coupled to receive a first select signal and having a second lead coupled to a second lead of said second transistor;

a fourth transistor having a first lead coupled to said data input lead and having a second lead coupled to a third lead of said third transistor;

a fifth transistor having a first lead coupled to said clock input lead and having a second lead coupled to a third lead of said fourth transistor;

a sixth transistor having a first lead coupled to receive a second select signal and having a second lead coupled to said second lead of said fifth transistor;

a seventh transistor having a first lead coupled to said scan input lead and having a second lead coupled to a third lead of said sixth transistor and a third lead coupled to said second lead of said third transistor;

a first inverter having an input lead coupled to said clock input lead of said first stage;

a second inverter having an input lead coupled to an output lead of said first inverter; and a logic gate having a first input lead coupled to said first node, a second input lead coupled to an output lead of said second inverter, and an output lead coupled to a third lead of said second transistor.

18. The circuit of claim 17, wherein said first and second select signals are respectively at logic high and logic low levels during a data mode.

19. The circuit of claim 17, wherein said first and second select signals are respectively at logic low and logic high levels during a scan mode.

20. The circuit of claim 17, wherein said third, fourth, sixth and seventh transistors are NMOS transistors.

* * * * *